(12) United States Patent
Lai

(10) Patent No.: US 8,373,973 B2
(45) Date of Patent: Feb. 12, 2013

(54) STACKABLE CAPACITOR STRUCTURE

(75) Inventor: Chun-An Lai, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 13 days.

(21) Appl. No.: 13/172,836

(22) Filed: Jun. 30, 2011

(65) Prior Publication Data

US 2012/0257321 A1  Oct. 11, 2012

(30) Foreign Application Priority Data

Apr. 7, 2011  (TW) .............................. 100112105 A

(51) Int. Cl.
*H01G 9/04* (2006.01)
*H01G 4/38* (2006.01)
*H01M 6/42* (2006.01)
*H01M 8/24* (2006.01)
*H01M 2/20* (2006.01)

(52) U.S. Cl. ........ 361/531; 361/541; 361/328; 429/156; 429/452; 429/467

(58) Field of Classification Search .................. 361/502, 361/531, 763, 328, 821, 704, 830, 541, 271, 361/117; 429/452, 467
See application file for complete search history.

(56) References Cited

U.S. PATENT DOCUMENTS

| 2008/0220315 A1* | 9/2008 | Dougherty et al. .............. 429/53 |
| 2012/0219846 A1* | 8/2012 | Chan .............................. 429/159 |

* cited by examiner

*Primary Examiner* — Eric Thomas
*Assistant Examiner* — Arun Ramaswamy
(74) *Attorney, Agent, or Firm* — Altis Law Group, Inc.

(57) ABSTRACT

A capacitor includes a main body, a first seat, and a second seat. The main body includes a first end surface and a second end surface opposite to the first end surface. Two first pins extend upward from the first end surface. Two second pins extend downward from the second end surface. The first pins electrically connect the second pins. The first seat includes a first substrate and two first pads, the first seat is positioned on the second end surface of the main body and the first pads are electrically connected to the second pins. The second seat includes a second substrate and two second pads, the second seat is positioned on the first end surface of the main body and the second pads are electrically connected to the first pins.

14 Claims, 3 Drawing Sheets

STACKABLE CAPACITOR STRUCTURE

BACKGROUND

1. Technical Field

The present disclosure relates to capacitors, and particularly, to a stackable capacitor structure.

2. Description of Related Art

Capacitors are typically used in circuits, and include a main body and a metal pad positioned at the bottom of the main body. The capacitors are mounted on a circuit board via the metal pads. As the electromagnetic interference of the other electronic elements, the number and parameter of each capacitor are hard to choose. When a small capacitor with low capacitance must be changed to a big capacitor with high capacitance, the circuit board needs to be redesigned for the big capacitor.

Therefore, it is desirable to provide a stackable capacitor structure which can overcome the limitations described.

DETAILED DESCRIPTION

Embodiments of the disclosure will now be described in detail, with reference to the accompanying drawings.

Figure 1:
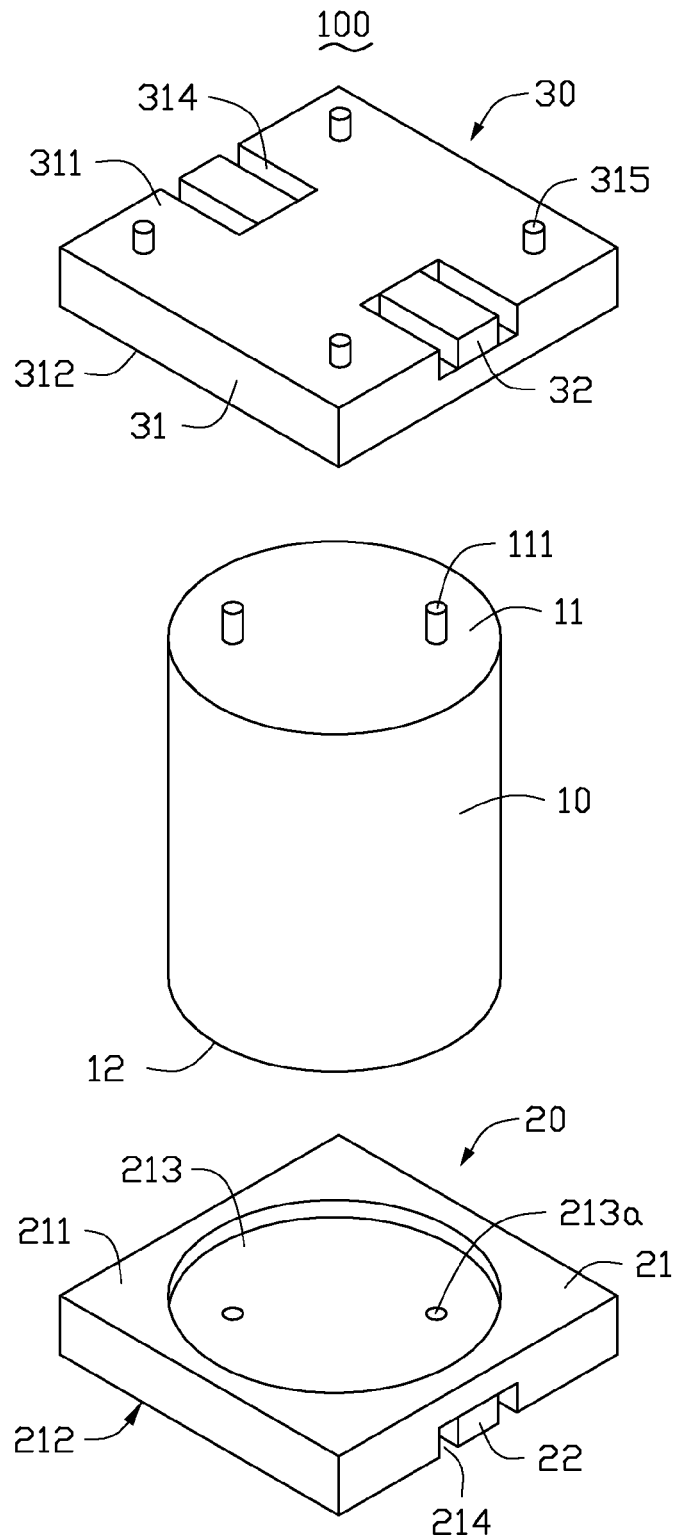
FIG. 1 is an isometric and exploded view of a capacitor in accordance with an exemplary embodiment.
Figure 2:
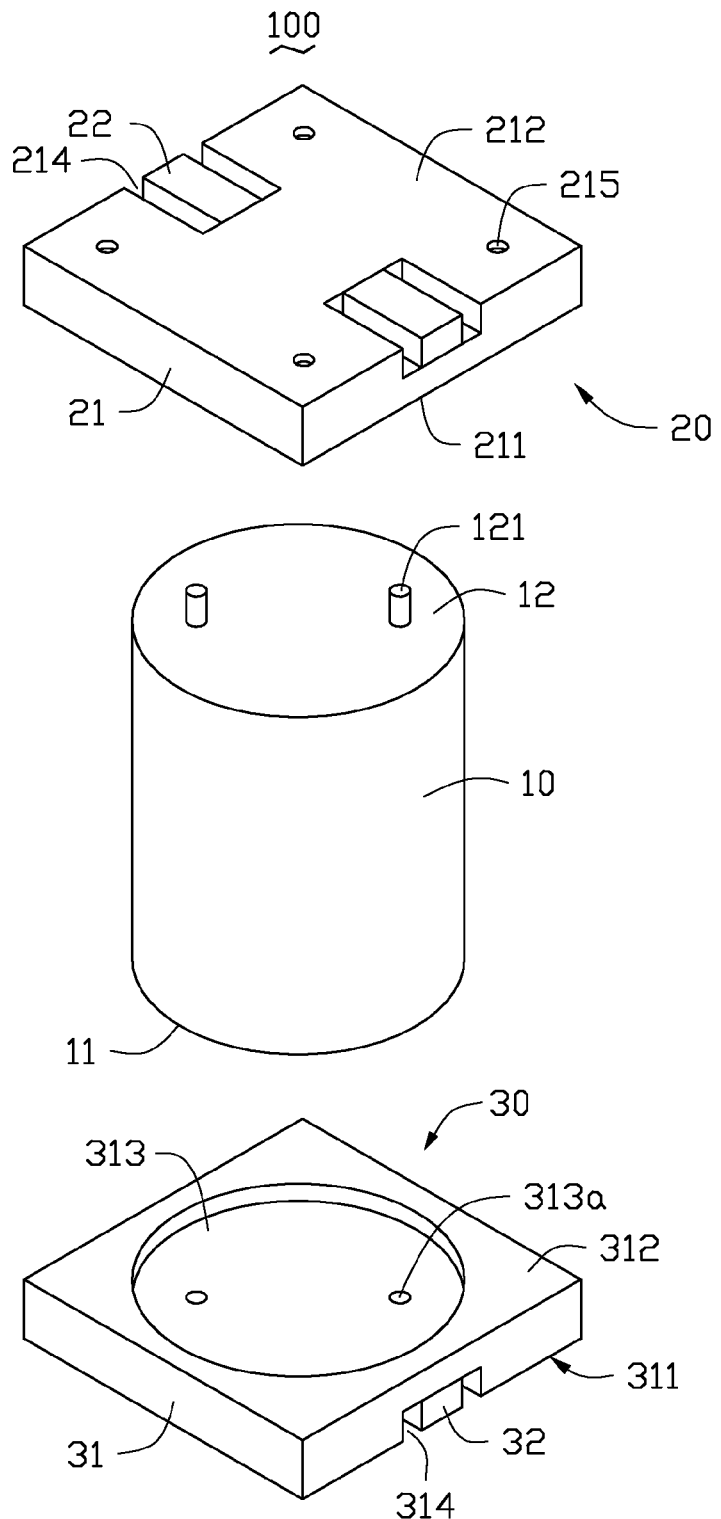
FIG. 2 is similar to FIG. 1, but viewed from another angle.

Referring to FIGS. 1-2, a capacitor 100, according to an exemplary embodiment, includes a main body 10, a first seat 20, and a second seat 30.

The main body 10 is cylindrical shaped, and includes a first end surface 11 and a second end surface 12 opposite to the first end surface 11. Two first pins 111 extend upward from the first end surface 11, and two second pins 121 extend downward from the second end surface 12. The first pins 111 electrically connect to the second pins 121 via inner structures of the main body 10.

The first seat 20 is rectangular shaped, and includes a first substrate 21 and two first pads 22 positioned on the first substrate 21. The first substrate 21 includes a first upper surface 211 and a first lower surface 212 opposite to the first upper surface 211. The first substrate 21 defines a first receiving hollow 213 in the middle of the first upper surface 211. The first receiving hollow 213 is cylindrical shaped, and the diameter of the first receiving hollow 213 is slightly greater than the diameter of the second end surface 12. The first substrate 21 defines two first position holes 213a at the bottom of the first receiving hollow 213.

The first substrate 21 defines two first slots 214 on the first lower surface 212. The two first slots 214 respectively communicate with two opposite sides of the first substrate 21. The two first slots 214 respectively communicate with the two first position holes 213a. The two first pads 22 are respectively received in the two first slots 214 and protrude from the first lower surface 212. The width of the first pads 22 extending along a direction parallel to the sides communicating with the first slots 214 is narrower than the width of the first slots 214. The first substrate 21 defines a number of position hollows 215 on the first lower surface 212, substantially adjacent to the corners thereof.

The second seat 30 is rectangular shaped, and includes a second substrate 31 and two second pads 32 positioned on the second substrate 31. The second substrate 31 includes a second upper surface 311 and a second lower surface 312 opposite to the second upper surface 311. The second substrate 31 defines two second slots 314 on the second upper surface 311. The two second slots 314 respectively communicate with two opposite sides of the second substrate 31. A number of position poles 315 extend upward from the second upper surface 311, substantially adjacent to the corners of the second substrate 31. The two second pads 32 are respectively received in the two second slots 314 and protrude from the second upper surface 311. The width of the second pads 32 extending along a direction parallel to the sides communicating with the second slots 214 is narrower than the width of the second slots 314.

The second substrate 31 defines a second receiving hollow 313 on the middle of the second lower surface 312. The second receiving hollow 313 is cylindrical shaped, and the diameter of the second receiving hollow 313 is slightly greater than the diameter of the first end surface 11. The second substrate 31 defines two second positioning holes 313a at the bottom of the second receiving hollow 313. The two second slots 314 respectively communicate with the two second positioning holes 313a.

In this embodiment, the number of the positioning hollows 215 and the position poles 315 is four. The first pads 22 and the second pads 32 are made of metal. The size of the first substrate 21 is the same as the second substrate 31.

In assembly, the second end surface 12 is received in the first receiving hollow 213 of the first substrate 21. The second pins 121 penetrate through the first positioning holes 213a and electrically contact with the first pads 22. The first end surface 11 is received in the second receiving hollow 313 of the second substrate 31. The first pins 111 penetrate through the second position holes 313a and electrically contact with the second pads 32.

Figure 3:
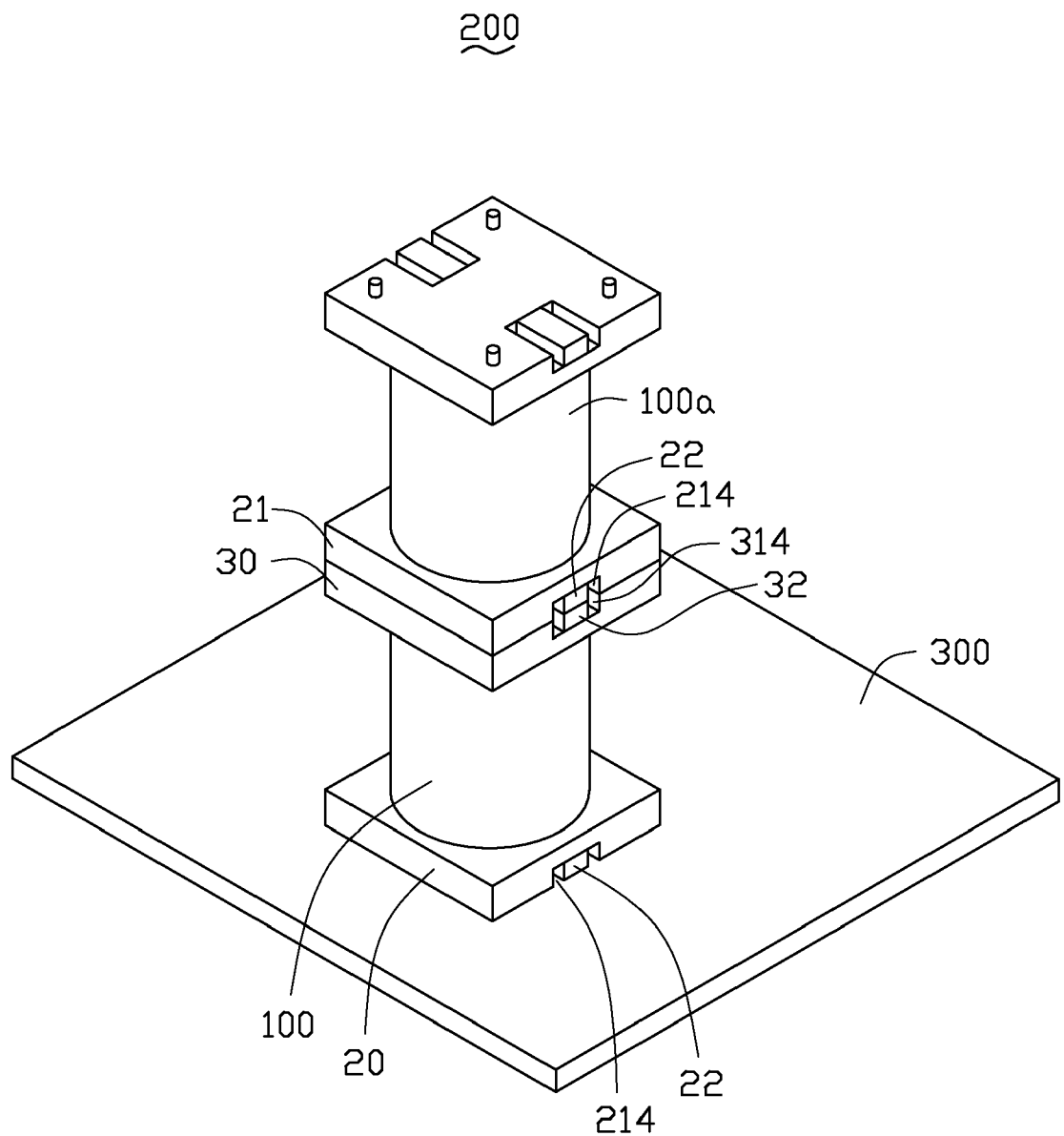
FIG. 3 is an assembled view of a stackable capacitor structure using capacitors of FIG. 1.

Referring to FIG. 3, a stackable capacitor structure 200, according to an exemplary embodiment, includes a first capacitor 100 and a second capacitor 100a. The structure of the first capacitor 100 is the same as the second capacitor 100a, and the second capacitor 100a is positioned on the first capacitor 100.

The first capacitor 100 is positioned on a circuit board 300. The circuit board 300 includes two pads (not shown) and four protrusions (not shown). The pads of the circuit board 300 are electrically connected to the first pads 22 of the first seat 20, and the protrusions of the circuit board 300 are received in the position hollows 215 of the first substrate 21. When the capacitance of the first capacitor 100 is needed to be increased, the second capacitor 100a is stacked upon the second seat 30 of the first capacitor 100. The position poles 315 of the second substrate 31 of the first capacitor 100 are received in the position hollows 215 of the first substrate 21 of the second capacitor 100a. The second pads 32 of the first capacitor 100 contact with the first pads 22 of the second capacitor 100a. Then a lot of tin (not shown) is injected into the second slots 314 of the first capacitor 100 and the first slots 214 of the second capacitor 100a. Therefore, the second capacitor 100a is firmly positioned upon the first capacitor 100.

Particular embodiments are shown and described by way of illustration only. The principles and the features of the present disclosure may be employed in various and numerous embodiments thereof without departing from the scope of the disclosure. The above-described embodiments illustrate the scope of the disclosure but do not restrict the scope of the disclosure.

What is claimed is:

1. A capacitor, comprising:
   a main body comprising a first end surface, a second end surface opposite to the first end surface, two first pins extending from the first end surface and two second pins extending from the second end surface, the first pins electrically connecting to the second pins;
   a first seat comprising a first substrate and two first pads, the first seat positioned on the second end surface of the main body, the first seat defining two first slots on a surface facing away the second end surface, each of the first pads received in a respective one of the first slots and electrically connecting to a respective one of the second pins; and
   a second seat comprising a second substrate and two second pads, the second seat positioned on the first end surface of the main body, the second seat defining two second slots on a surface facing away the first end surface, each of the second pads received in a respective one of the second slots and electrically connecting to a respective one of the first pins.

2. The capacitor of claim 1, wherein the first substrate comprises a first upper surface and a first lower surface opposite to the first upper surface, the first substrate defines a first receiving hollow in the first upper surface and two first position holes at the bottom of the first receiving hollow, the two first slots are defined on the first lower surface, the second end surface is received in the first receiving hollow, the second pins respectively penetrate through the first position holes.

3. The capacitor of claim 2, wherein the two first slots communicate with the first position holes respectively.

4. The capacitor of claim 3, wherein the first slots communicate with two opposite sides of the first substrate, the width of the first pads extending along a direction parallel with the sides communicating with the first slots is narrower than the width of the first slots.

5. The capacitor of claim 2, wherein the first substrate defines a plurality of position hollows in the first lower surface, substantially adjacent to the corners of the first substrate.

6. The capacitor of claim 1, wherein the second substrate comprises a second upper surface and a second lower surface opposite to the second upper surface, the second substrate defines a second receiving hollow in the second lower surface and two second position holes at the bottom of the second receiving hollow, the two second slots are defined on the second upper surface, the first end surface is received in the second receiving hollow, the first pins respectively penetrate through the second position holes.

7. The capacitor of claim 6, wherein the two second slots communicate with the second position holes respectively.

8. The capacitor of claim 7, wherein the second slots communicate with two opposite sides of the second substrate, the width of the second pads extending along a direction parallel with the sides communicating with the second slots is narrower than the width of the second slots.

9. The capacitor of claim 6, wherein the second substrate comprises a plurality of position poles extending from the second upper surface, substantially adjacent to the corners of the second substrate.

10. A stackable capacitor structure, comprising: a first capacitor and a second capacitor positioned upon the first capacitor, each of the capacitors comprising:
    a main body comprising a first end surface, a second end surface opposite to the first end surface, two first pins extending from the first end surface and two second pins extending from the second end surface, the first pins electrically connecting to the second pins;
    a first seat comprising a first substrate and two first pads, the first seat positioned on the second end surface of the main body, the first seat defining two first slots on a surface facing away the second end surface, each of the first pads received in a respective one of the first slots and electrically connecting to a respective one of the second pins, the first substrate defining a plurality of position hollows; and
    a second seat comprising a second substrate and two second pads, the second seat positioned on the first end surface of the main body, the second seat defining two second slots on a surface facing away the first end surface, each of the second pads received in a respective one of the second slots and electrically connecting to a respective one of the first pins, the second substrate comprising a plurality of position poles extending from a surface thereof,
    wherein the position poles of the second substrate of the first capacitor are received in the position hollows of the first substrate of the second capacitor, the second pads of the first capacitor contact the first pads of the second capacitor.

11. The stackable capacitor structure of claim 10, wherein the first substrate comprises a first upper surface and a first lower surface opposite to the first upper surface, the first substrate defines a first receiving hollow in the first upper surface and two first position holes at the bottom of the first receiving hollow, the two first slots are defined on the first lower surface, the second end surface is received in the first receiving hollow, the second pins respectively penetrate through the first position holes.

12. The stackable capacitor structure of claim 11, wherein the two first slots communicate with the first position holes respectively.

13. The stackable capacitor structure of claim 10, wherein the second substrate comprises a second upper surface and a second lower surface opposite to the second upper surface, the second substrate defines a second receiving hollow in the second lower surface and two second position holes at the bottom of the second receiving hollow, the two second slots are defined on the second upper surface, the first end surface is received in the second receiving hollow, the first pins respectively penetrate through the second position holes.

14. The stackable capacitor structure of claim 13, wherein the two second slots communicate with the second position holes respectively.

* * * * *